(12) United States Patent
Kang

(10) Patent No.: US 7,777,548 B2
(45) Date of Patent: Aug. 17, 2010

(54) LEVEL SHIFTER

(75) Inventor: Tae Jin Kang, Suwon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 48 days.

(21) Appl. No.: 12/215,774

(22) Filed: Jun. 30, 2008

(65) Prior Publication Data

US 2009/0237139 A1  Sep. 24, 2009

(30) Foreign Application Priority Data

Mar. 18, 2008  (KR)  .................. 10-2008-0024984

(51) Int. Cl.
*H03L 5/00* (2006.01)
(52) U.S. Cl. .................. 327/333; 326/63; 326/81
(58) Field of Classification Search .......... 326/62–63, 326/80–81; 327/306, 333
See application file for complete search history.

(56) References Cited

U.S. PATENT DOCUMENTS

| 6,720,802 | B2* | 4/2004 | Cho ................ 327/108 |
| 7,005,897 | B2* | 2/2006 | Lim ................ 327/112 |
| 7,230,475 | B2* | 6/2007 | Choi et al. .......... 327/544 |
| 7,368,970 | B2 | 5/2008 | Lin et al. |
| 7,385,441 | B2 | 6/2008 | Liu |

FOREIGN PATENT DOCUMENTS

KR  10-2006-0079349 A  7/2006

* cited by examiner

*Primary Examiner*—Dinh T. Le
(74) *Attorney, Agent, or Firm*—John P. White; Cooper & Dunham LLP

(57) ABSTRACT

A level shifter includes a level shifting unit for level-shifting an input signal at a first voltage level into a signal at a second voltage level, and an output controller for controlling the level shifting unit to maintain output at a predetermined logic level in response to a deep power down mode signal generated from power which is not turned off in a deep power down mode.

25 Claims, 5 Drawing Sheets

LEVEL SHIFTER

TECHNICAL FIELD

This disclosure relates to a semiconductor memory, and more particularly, to a level shifter.

BACKGROUND

In general, a level shifter changes a level of operation power used for a memory circuit, and more specifically the level shifter typically shifts the level of internal voltage from a lower level to a higher level.

FIG. 1 is a circuit diagram illustrating a level shifter according to the related art.

As illustrated in FIG. 1, the level shifter according to the prior art shifts an input signal Vin at a low voltage level (B power) into a signal Vout at a high voltage level (A Power) and then outputs the signal Vout.

For example, when the input signal Vin is high, a node C becomes low, so that an NMOS transistor N2 is turned off. However, a node D becomes high, so that an NMOS transistor N4 is turned on.

As the NMOS transistor N4 is turned on, a node B becomes low, so that an inverter INV2 outputs a high output signal Vout at a high voltage level (A Power).

Meanwhile, a semiconductor memory turns off most internal powers to reduce the amount of consumed current in a deep power down mode. Hereinafter, an operation of the level shifter of FIG. 1 in the deep power down mode will be described as follows.

For example, when an internal power (B power) is turned off in the deep power down mode, the inverters INV1 and INV3 and the NMOS transistors N1 and N2, which use the B power, do not operate, so that the nodes C and D are floated. In detail, the nodes C and D are maintained in an unclear logic level state.

Thus, the nodes A and B are maintained in an unclear logic level state, so that electric current from the A power may flow into the ground through the PMOS transistors P1 and P2 and the NMOS transistors N3 and N4.

BRIEF SUMMARY

In an aspect of the present invention, a level shifter is provided that is capable of reducing the amount of consumed current in a deep power down mode.

In an embodiment, a level shifter comprises a level shifting unit configured to shift an input signal at a first voltage into a signal at a second voltage, an output controller configured to control the level shifting unit to maintain output at a predetermined logic level in response to a deep power down mode signal generated from a power source that is not turned off in a deep power down mode.

In another embodiment, a level shifter comprises a level shifting unit configured to shift an input signal at a first voltage into a signal at a second voltage, a deep power down mode signal configured to be generated from a power that is not turned off in a deep power down mode, and an output controller configured to maintain nodes of the level shifting unit, which are floated in the deep power down mode, at a predetermined logic level by using the second voltage and the deep power down mode signal, to control output of the level shifting unit to be fixed to a predetermined logic level.

In a level shifter according to embodiments of the present invention, nodes of a level shifting unit, which may be floated in a deep power down mode, are maintained at a predetermined logic level, so that the output of the level shifting unit can be fixed to a predetermined logic level. Thus, current consumption can be reduced.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF THE PREFERRED EMBODIMENTS

Hereinafter, examples and exemplary embodiments of the present invention will be described with reference to accompanying drawings. The examples and embodiments are provided for illustrative purposes only, and the scope of the present invention is not limited thereto.

Figure 1:
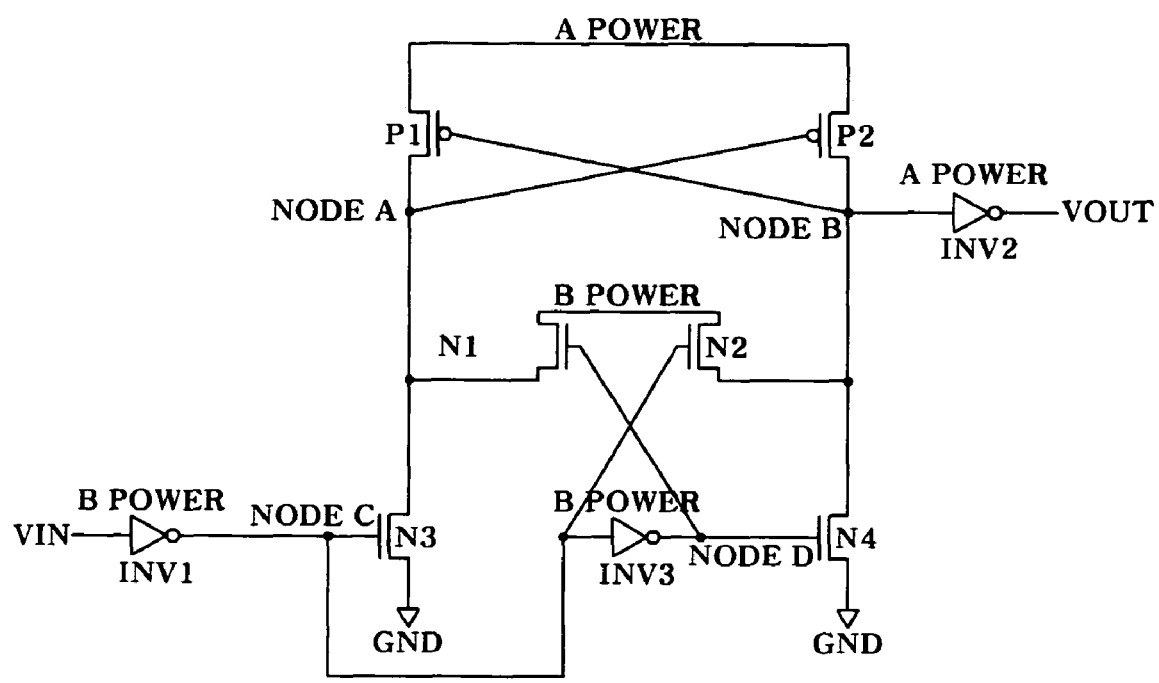
FIG. 1 is a circuit diagram illustrating a level shifter according to the prior art.
Figure 2:
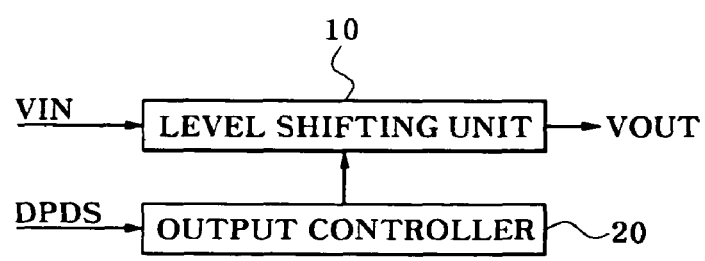
FIG. 2 is a block diagram illustrating a level shifter according to the present invention.

FIG. 2 is a block diagram illustrating a level shifter according to the present invention.

As illustrated in FIG. 2, the level shifter according to the present invention includes a level shifting unit 10 and an output controller 20. The level shifting unit 10 level-shifts an input signal Vin at a first voltage level into a signal Vout at a second voltage level. The output controller 20 controls the level shifting unit 10 in response to a deep power down mode signal activated in a deep power down mode such that the level shifting unit 10 maintains its output at a predetermined logic level.

The output controller 20 maintains nodes of the level shifting unit 10, which are floated in the deep power down mode, at a predetermined logic level by using the deep power down mode signal and the second voltage. The second voltage is not turned off in the deep power down mode.

Figure 3A:
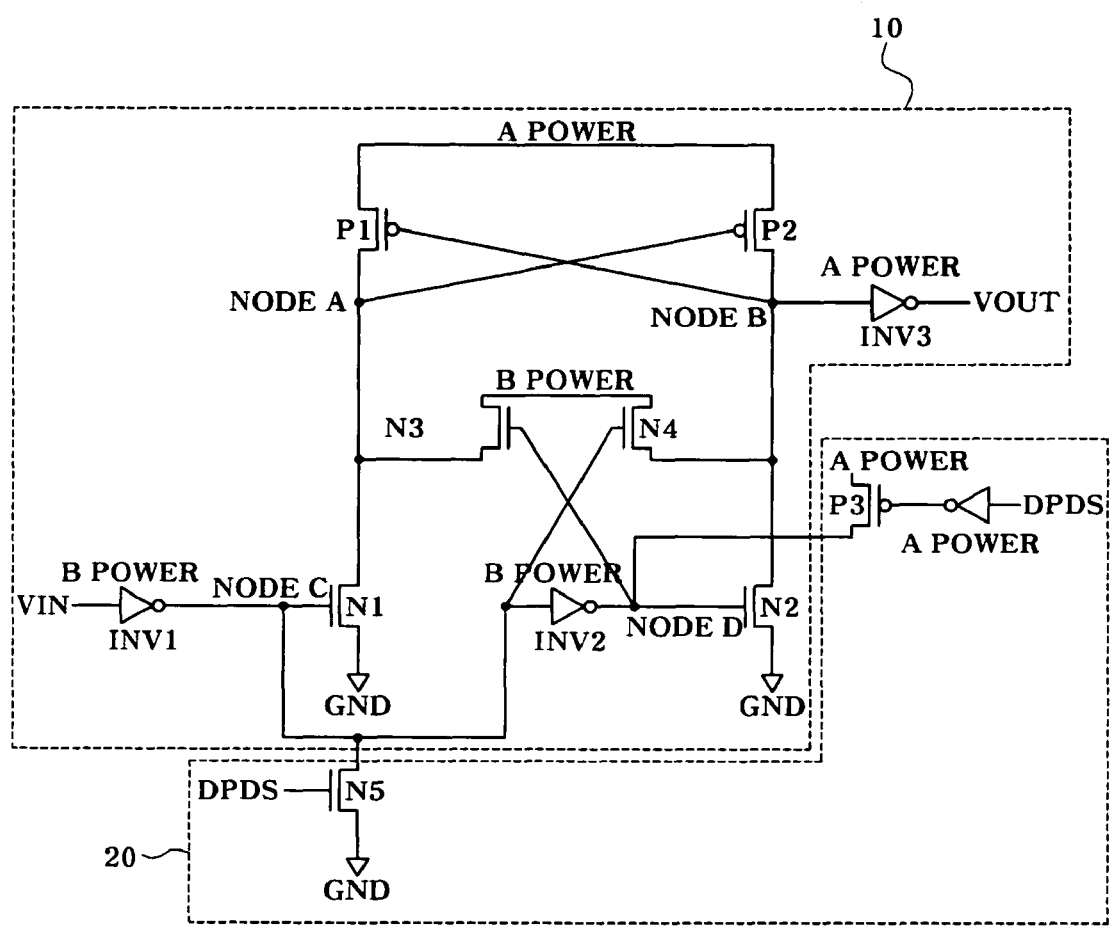
FIGS. 3A to 3D are circuit diagrams illustrating a level shifter according to exemplary embodiments of the present invention.

FIGS. 3A to 3D are circuit diagrams illustrating the level shifter according to exemplary embodiments of the present invention. FIG. 3A is a circuit diagram illustrating an embodiment in which output (Vout) is maintained at a high logic level when an internal power (B power) is not turned off in the deep power down mode.

As illustrated in FIG. 3A, the level shifting unit 10 includes a first inverter INV1, a first NMOS transistor N1, a second inverter INV2 and a second NMOS transistor N2. The first inverter INV1 inverts the input signal Vin at a low voltage level (B power). The first NMOS transistor N1 receives an output signal of the first inverter INV1 as a gate input signal thereof. The second inverter INV2 inverts the output signal of the first inverter INV1. The second NMOS transistor N2 receives an output signal of the second inverter INV2 as a gate input signal thereof.

Further, the level shifting unit 10 includes a third NMOS transistor N3, a fourth NMOS transistor N4, a first PMOS transistor P1 and a second PMOS transistor P2. The third NMOS transistor N3 receives an output signal of the second inverter INV2 as a gate input signal thereof, and has a drain terminal connected with a drain terminal of the first NMOS transistor N1. The fourth NMOS transistor N4 receives the output signal of the first inverter INV1 as a gate input signal thereof, and has a drain terminal connected with a drain terminal of the second NMOS transistor N2. The first PMOS transistor P1 receives drain voltage of the second NMOS transistor N2 as a gate input signal thereof. The second PMOS transistor P2 receives drain voltage of the first NMOS transistor N1 as a gate input signal thereof.

The first and second inverters INV1 and INV2, and the third and fourth NMOS transistors N3 and N4 receive the first voltage (B power) as supply voltage, and the first and second PMOS transistors P1 and P2 receive the second voltage (A power) as supply voltage.

The output controller 20 includes a fifth NMOS transistor N5 and a third PMOS transistor P3. The fifth NMOS transistor N5 maintains an output node of the first inverter INV1 at a low logic level in response to the deep power down mode signal activated in the deep power down mode. The third PMOS transistor P3 maintains an output node of the second inverter INV2 at a high logic level in response to an inversion signal of the deep power down mode signal.

The third PMOS transistor P3 receives the second voltage (A power), which is not turned off in the deep power down mode, as supply voltage.

According to the exemplary construction of the present invention as described above in connection with FIG. 3A, in the deep power down mode, the node C maintains a low logic level by the fifth NMOS transistor N5 regardless of a voltage level of the input signal Vin, and the node D maintains a high logic level by the third PMOS transistor P3.

Further, the node B maintains a low logic level, and the final output is fixed to a high logic level by the third inverter INV3.

According to the exemplary embodiment of the present invention as described above in connection with FIG. 3A, in the deep power down mode, the floated nodes are maintained at a predetermined logic level, so that a current of the second voltage (A power) can be prevented from flowing into the ground through the PMOS transistors P1 and P2 and the NMOS transistors N3 and N4. Thus, current consumption can be reduced.

Figure 3B:
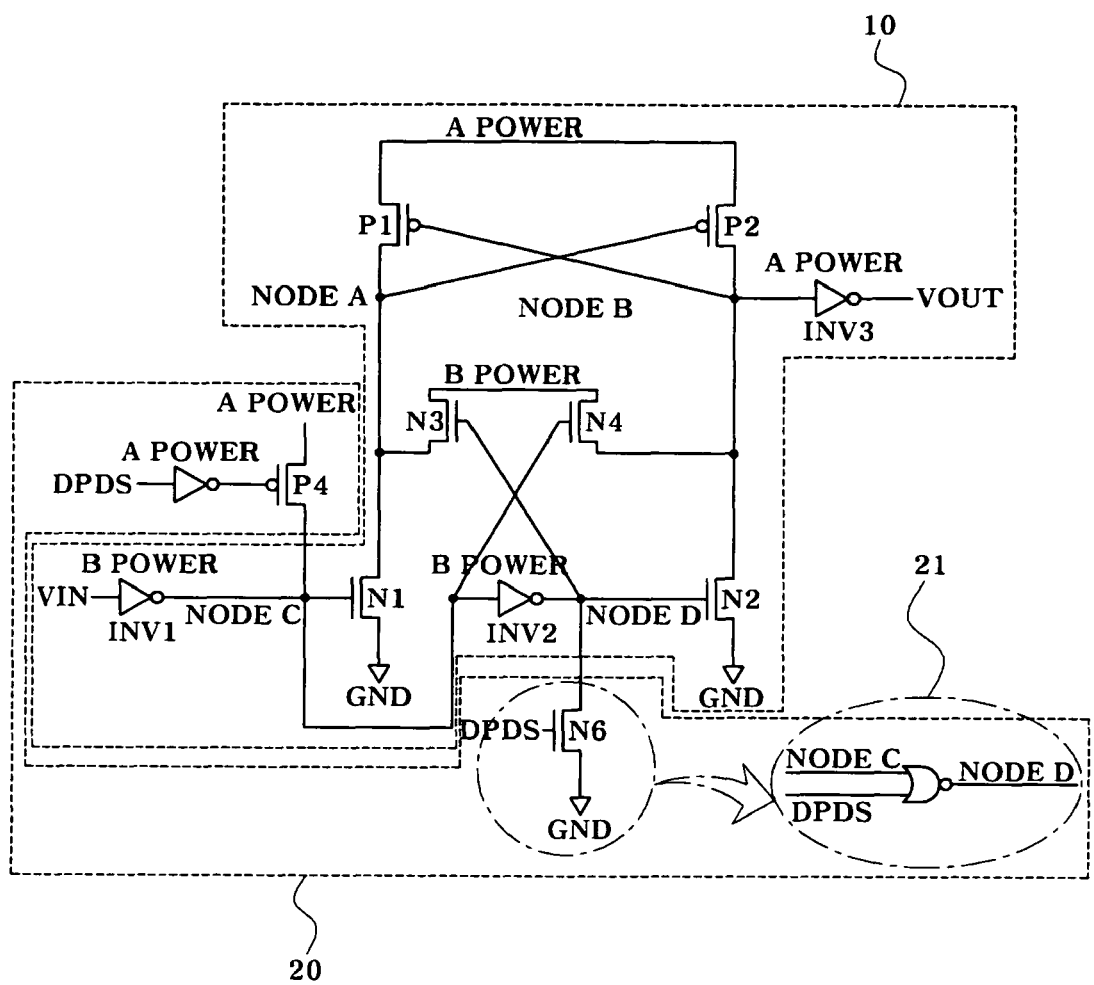

FIG. 3B is a circuit diagram illustrating another embodiment in which the output (Vout) is maintained at a low logic level when the internal power (B power) is not turned off in the deep power down mode.

As illustrated in FIG. 3B, the level shifting unit 10 has a construction similar to that of the level shifting unit 10 of FIG. 3A. The output controller 20 includes a fourth PMOS transistor P4 and a sixth NMOS transistor N6. The fourth PMOS transistor P4 maintains the output node of the first inverter INV1 at a high logic level in response to an inversion signal of the deep power down mode signal in the deep power down mode. The sixth NMOS transistor N6 maintains the output node of the second inverter INV2 at a low logic level in response to the deep power down mode signal.

The fourth PMOS transistor P4 receives the second voltage (A power), which is not turned off in the deep power down mode, as supply voltage.

According to the exemplary construction of the present invention as described above in connection with FIG. 3B, in the deep power down mode, the node C maintains a high logic level by the fourth PMOS transistor P4 regardless of a voltage level of the input signal Vin, and the node D maintains a low logic level by the sixth NMOS transistor N6.

Thus, the node A is at a low logic level and the node B is at a high logic level, so that the final output is fixed to a low logic level by the third inverter INV3.

As illustrated in FIG. 3B, according to another embodiment, the level shifter includes an operation unit 21 that maintains the output node D of the second inverter INV2 at a low logic level by NORing the deep power down mode signal DPDS and the output node signal NODE C of the first inverter INV1, instead of the sixth NMOS transistor N6.

Figure 3C:
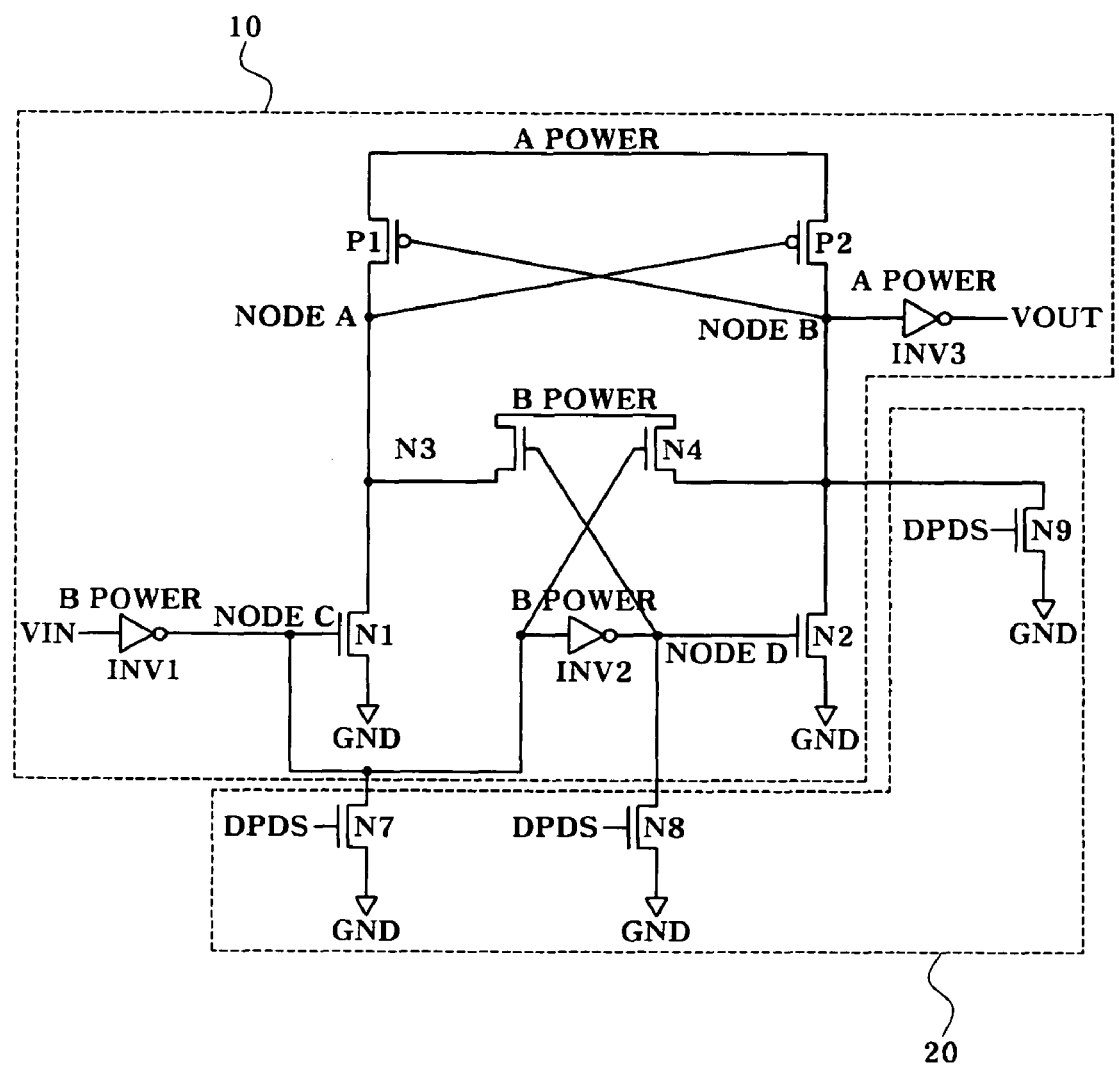

FIG. 3C is a circuit diagram illustrating another embodiment in which the output (Vout) is maintained at a high logic level when the internal power (B power) is not turned off in the deep power down mode.

As illustrated in FIG. 3C, the level shifting unit 10 has a construction similar to that of the level shifting unit 10 of the other exemplary embodiments. The output controller 20 includes seventh to ninth NMOS transistor N7 to N9. The seventh NMOS transistor N7 maintains the output node of the first inverter INV1 at a low logic level in response to the deep power down mode signal in the deep power down mode. The eight NMOS transistor N8 maintains the output node of the second inverter INV2 at a low logic level in response to the deep power down mode signal. The ninth NMOS transistor N9 maintains the drain node of the second NMOS transistor N2 at a low logic level in response to the deep power down mode signal.

According to the exemplary construction of the present invention as described above in connection with FIG. 3C, in the deep power down mode, the node C maintains a low logic level by the seventh NMOS transistor N7 regardless of a voltage level of the input signal Vin, the node D maintains a low logic level by the eight NMOS transistor N8, and the node B maintains a low logic level by the ninth NMOS transistor N9.

Thus, the final output (Vout) is fixed to a high logic level by the third inverter INV3.

Figure 3D:
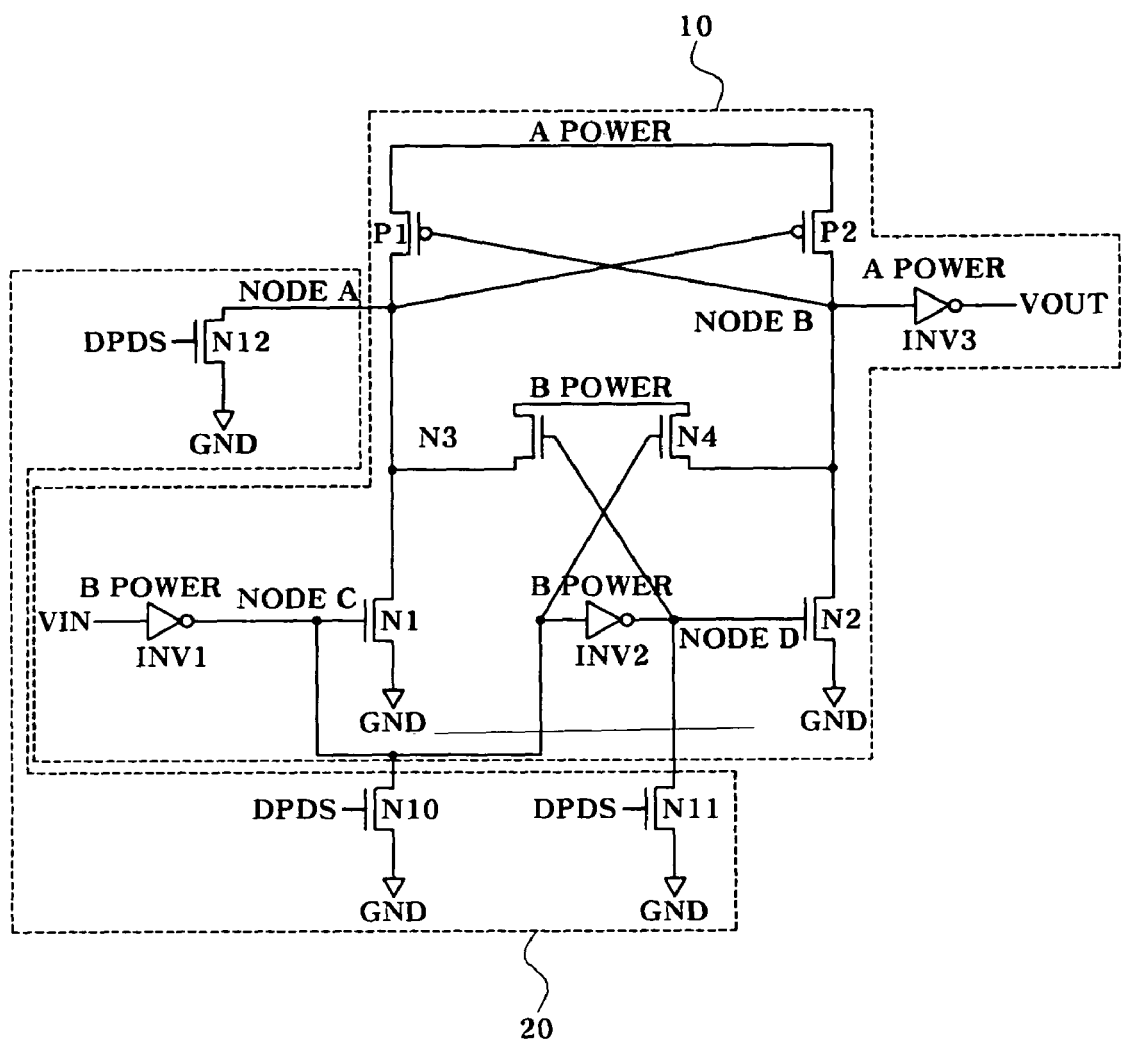

FIG. 3D is a circuit diagram illustrating still another embodiment in which the output (Vout) is maintained at a low logic level when the internal power (B power) is not turned off in the deep power down mode.

As illustrated in FIG. 3D, the level shifting unit 10 has a construction similar to that of the level shifting unit 10 of the other exemplary embodiments. The output controller 20 includes tenth to twelfth NMOS transistor N10 to N12. The tenth NMOS transistor N10 maintains the output node of the first inverter INV1 at a low logic level in response to the deep power down mode signal in the deep power down mode. The eleventh NMOS transistor N11 maintains the output node of the second inverter INV2 at a low logic level in response to the deep power down mode signal. The twelfth NMOS transistor N12 maintains the drain node of the first NMOS transistor N1 at a low logic level in response to the deep power down mode signal.

According to the embodiment of the present invention as described above in connection with FIG. 3D, in the deep power down mode, the node C maintains a low logic level by the tenth NMOS transistor N10 regardless of a voltage level of the input signal Vin, the node D maintains a low logic level by the eleventh NMOS transistor N11, and the node A maintains a low logic level by the twelfth NMOS transistor N12.

Thus, the node B is at a high logic level, so that the final output (Vout) is fixed to a low logic level by the third inverter INV3.

According to the present invention as described above, the nodes A, B, C and D of the level shifter 10, which may be floated in the deep power down mode, are maintained at a predetermined logic level, so that electric current of the second voltage (A power), which is not turned off, can be prevented from flowing into ground through the PMOS transistors P1 and P2 and the NMOS transistors N3 and N4. Thus, current consumption can be reduced.

While the present invention has been described with respect to the particular examples and embodiments, it will be apparent to those skilled in the art that various changes and modifications may be made without departing from the spirit and scope of this disclosure and the following claims.

This disclosure claims priority to Korean application number 10-2008-0024984, filed on Mar. 18, 2008, the entire contents of which are incorporated herein by reference.

What is claimed is:

1. A level shifter comprising:
    a first inverter configured to invert an input signal and output an inverted input signal;
    a level shifting unit having a first node configured to receive the input signal and a second node configured to receive the inverted input signal, and the level shifting unit configured to shift the input signal at a first voltage into a shifting signal at a second voltage;
    a first controller configured to maintain the first node at a first logic level in response to a deep power down mode signal; and
    a second controller configured to maintain the second node at a second logic level in response to the deep power down mode signal.

2. The level shifter of claim 1, wherein when the first logic level is a high logic level, the second logic level is a low logic level, and when the first logic level is a low logic level, the second logic level is a high logic level.

3. The level shifter of claim 1, wherein a supply of the first voltage is interrupted when the deep power down signal is activated and a supply of the second voltage is not interrupted when the deep power down mode signal is activated.

4. The level shifter of claim 3, wherein the second voltage is higher than the first voltage.

5. The level shifter of claim 1, wherein the level shifting unit includes:
    a first NMOS transistor configured to receive the input signal as a gate input signal of the first NMOS transistor;
    a second NMOS transistor configured to receive the inverted input signal as a gate input signal of the second NMOS transistor;
    a third NMOS transistor configured to receive the inverted input signal as a gate input signal of the third NMOS transistor, and having a drain terminal connected with a drain terminal of the first NMOS transistor;
    a fourth NMOS transistor configured to receive the input signal as a gate input signal of the fourth NMOS transistor, and having a drain terminal connected with a drain terminal of the second NMOS transistor;
    a first PMOS transistor configured to receive drain voltage of the second NMOS transistor as a gate input signal of the first PMOS transistor; and
    a second PMOS transistor configured to receive drain voltage of the first NMOS transistor as a gate input signal of the second PMOS transistor.

6. The level shifter of claim 2, wherein the high logic level is determined by the second voltage and the low logic level is determined by a ground voltage.

7. The level shifter of claim 6, wherein the first controller includes:
    a fifth NMOS transistor configured to maintain the gate terminal of the first NMOS transistor at the low logic level in response to the deep power down mode signal.

8. The level shifter of claim 6, wherein the first controller includes a third PMOS transistor configured to maintain the gate terminal of the first NMOS transistor at the high logic level in response to the deep power down mode signal.

9. The level shifter of claim 6, wherein the second controller includes:
    a sixth NMOS transistor configured to maintain the gate terminal of the second NMOS transistor at the low logic level in response to the deep power down mode signal.

10. The level shifter of claim 6, wherein the second controller includes the fourth PMOS transistor configured to maintain the gate terminal of the second NMOS transistor at the high logic level in response to the deep power down mode signal.

11. The level shifter of claim 6, wherein the second controller includes
    an operation unit configured to maintain the gate terminal of the second NMOS transistor at the low logic level by NORing the deep power down mode signal and the input signal.

12. A level shifter comprising:
    a first NMOS transistor configured to receive an input signal at a first voltage as a gate input signal of the first NMOS transistor;
    a first inverter configured to invert the input signal and output an inverted input signal;
    a second NMOS transistor configured to receive the inverted input signal as a gate input signal of the second NMOS transistor;
    a first PMOS transistor configured to receive a drain voltage of the second NMOS transistor as a gate input signal of the first PMOS transistor;
    a second PMOS transistor configured to receive a drain voltage of the first NMOS transistor as a gate input signal of the second PMOS transistor and having a drain terminal connected with an output node configured to output a shifting signal at a second voltage;
    a first controller configured to maintain a gate terminal of the first NMOS transistor at a first logic level in response to a deep power down mode signal;
    a second controller configured to maintain a gate terminal of the second NMOS transistor at the first logic level in response to the deep power down mode signal; and
    a third controller configured to maintain the output node at the first logic level in response to the deep power down mode signal.

13. The level shifter of claim 12, wherein a supply of the first voltage is interrupted when the deep power down signal is activated and a supply of the second voltage is not interrupted when the deep power down mode signal is activated.

14. The level shifter of claim 12, further comprising:
    a second inverter configured to invert a signal and output the input signal at the first voltage;
    a third NMOS transistor configured to receive the inverted input signal as a gate input signal of the third NMOS transistor, and having a drain terminal connected with a drain terminal of the first NMOS transistor; and
    a fourth NMOS transistor configured to receive the input signal as a gate input signal of the fourth NMOS transistor, and having a drain terminal connected with a drain terminal of the second NMOS transistor.

15. The level shifter of claim 14, wherein the first logic level is a low logic level and the low logic level is determined by a ground voltage.

16. The level shifter of claim 12, wherein the first controller includes
    a fifth NMOS transistor configured to maintain the gate terminal of the first NMOS transistor at a low logic level in response to the deep power down mode signal.

17. The level shifter of claim 12, wherein the second controller includes
a sixth NMOS transistor configured to maintain a gate terminal of the second inverter NMOS transistor at a low logic level in response to the deep power down mode signal.

18. The level shifter of claim 12, wherein the third controller includes
an eighth NMOS transistor configured to maintain the output node at a low logic level in response to the deep power down mode signal.

19. A level shifter comprising:
a first NMOS transistor configured to receive an input signal at a first voltage as a fate input signal of the first NMOS transistor;
a first inverter configured to invert the input signal and output an inverted input signal;
a second NMOS transistor configured to receive the inverted input signal as a fate input signal of the second NMOS transistor;
a first PMOS transistor configured to receive a drain voltage of the second NMOS transistor as a fate input signal of the first PMOS transistor;
a second PMOS transistor configured to receive a drain voltage of the first NMOS transistor as a fate input signal of the second PMOS transistor and having a drain terminal connected with an output mode configured to output a shifting signal at a second voltage;
a first controller configured to maintain a gate terminal of the first NMOS transistor at a first logic level in response to a deep power down mode signal;
a second controller configured to maintain a gate terminal of the second NMOS transistor at the first logic level in response to the deep power down mode signal; and
a third controller configured to maintain a gate terminal of the second PMOS transistor at the first logic level in response to the deep power down mode signal.

20. The level shifter of claim 19, wherein a supply of the first voltage is interrupted when the deep power down signal is activated and a supply of the second voltage is not interrupted when the deep power down mode signal is activated.

21. The level shifter of claim 19, further comprising:
a second inverter configured to invert a signal and output the input signal at the first voltage;
a third NMOS transistor configured to receive the inverted input signal as a fate input signal of the third NMOS transistor, and having a drain terminal connected with a drain terminal of the first NMOS transistor; and
a fourth NMOS transistor configured to receive the input signal as a gate input signal of the fourth NMOS transistor, and having a drain terminal connected with a drain terminal of the second NMOS transistor.

22. The level shifter of claim 21, wherein the first logic level is a low logic level and the low logic level is determined by a ground voltage.

23. The level shifter of claim 19, wherein the first controller includes a fifth NMOS transistor configured to maintain the gate terminal of the first NMOS transistor at a low logic level in response to the deep power down mode signal.

24. The level shifter of claim 19, wherein the second controller includes a sixth NMOS transistor configured to maintain a gate terminal of the second NMOS transistor at a low logic level in response to the deep power down mode signal.

25. The level shifter of claim 19, wherein the third controller includes an eighth NMOS transistor configured to maintain the gate terminal of the second PMOS transistor at a low logic level in response to the deep power down mode signal.

* * * * *